United States Patent

Riechert et al.

[11] Patent Number: 6,117,615

[45] Date of Patent: Sep. 12, 2000

[54] METHOD FOR MOUNTING MULTIPLE PRINTING ELEMENTS ONTO A CYLINDRICAL ELEMENT

[75] Inventors: Stephan Riechert, Frankfurt; Sascha Nau, Neu-Anspach, both of Germany

[73] Assignee: E. I. du Pont de Nemours and Company, Wilmington, Del.

[21] Appl. No.: 09/362,470

[22] Filed: Jul. 28, 1999

[51] Int. Cl.[7] .................................................. G03C 1/76
[52] U.S. Cl. .................................. 430/273.1; 430/270.1; 101/486
[58] Field of Search ........................ 430/270.1, 273.1, 430/286.1, 269; 101/401.1, 486

[56] References Cited

U.S. PATENT DOCUMENTS

| | | | |
|---|---|---|---|
| 4,323,637 | 4/1982 | Chen et al. ................................ | 430/271 |
| 4,520,389 | 5/1985 | Hornschuh ................................ | 358/107 |
| 4,546,702 | 10/1985 | Dorow ................................ | 101/415.1 |
| 4,653,369 | 3/1987 | Dunsim ................................ | 83/411 |
| 4,872,407 | 10/1989 | Banke ................................ | 101/389.1 |
| 5,262,275 | 11/1993 | Fan ................................ | 430/273 |
| 5,488,781 | 2/1996 | Van Der Horst ................................ | 33/617 |
| 5,607,814 | 3/1997 | Fan et al. ................................ | 430/258 |
| 5,760,880 | 6/1998 | Fan et al. ................................ | 430/201 |
| 5,850,789 | 12/1998 | Rudolf et al. ................................ | 101/486 |
| 5,916,403 | 6/1999 | Cushner et al. ................................ | 156/244.13 |

FOREIGN PATENT DOCUMENTS 0 329 228 B1  1/1993  European Pat. Off. ........ B41F 27/00

*Primary Examiner*—Cynthia Hamilton
*Assistant Examiner*—Barbara Gilmore
*Attorney, Agent, or Firm*—Thomas H. Magee

[57] ABSTRACT

A method provides for mounting at least one photosensitive printing element onto a cylindrical element containing a previously mounted first photosensitive printing element without contacting an outermost surface of the first photosensitive printing element.

7 Claims, 1 Drawing Sheet

METHOD FOR MOUNTING MULTIPLE PRINTING ELEMENTS ONTO A CYLINDRICAL ELEMENT

BACKGROUND OF THE INVENTION

1. Field of the Invention

This invention pertains to a method for mounting multiple photopolymerizable printing elements onto a cylindrical element, and particularly a method for mounting flexographic printing elements each having a laser radiation-sensitive layer onto a cylindrical drum.

2. Description of Related Art

Photopolymer printing plates are well known for use in flexographic printing, particularly on surfaces which are soft and easily deformable, such as packaging material, i.e., cardboard, plastic films, etc. Flexographic printing plates can be prepared from photopolymerizable compositions, such as those described in U.S. Pat. No. 4,323,637. The photopolymerizable compositions are used to form photosensitive elements, and generally comprise an elastomeric binder, at least one monomer, and a photoinitiator. Photosensitive elements generally have a photopolymerizable layer interposed between a support and a coversheet or multilayer cover element. Upon imagewise exposure to actinic radiation, polymerization, and hence insolubilization of the photopolymerizable layer occurs in the exposed areas. Treatment with a suitable solvent removes the unexposed areas of the photopolymerizable layer leaving a printing relief that can be used for flexographic printing.

Imagewise exposure of a photosensitive element requires the use of a phototool which is a mask having clear and opaque areas covering the photopolymerizable layer. The phototool prevents exposure and polymerization in the opaque areas, and allows exposure to radiation in the clear areas so that these areas polymerize and remain on the support after the development step. Recently the need for a separate phototool has been eliminated by the availability of photosensitive elements that include a laser radiation sensitive layer covering the photopolymerizable layer.

U.S. Pat. Nos. 5,262,275 and 5,607,814 disclose a photosensitive printing element having a laser radiation sensitive layer and method for forming a flexographic printing plate from the photosensitive element. The photosensitive printing element includes in order a support, at least one photopolymerizable layer, a barrier layer, a laser radiation sensitive layer, and a coversheet. EP 741 330 also discloses a photosensitive printing element having a laser radiation sensitive layer which includes in order a support, at least one photopolymerizable layer, a laser radiation sensitive layer, and a coversheet. After removing the coversheet from the photosensitive element, the laser radiation sensitive layer is imagewise ablated from the photosensitive element to form an in-situ mask on the element. Thereafter, the photosensitive element is blanket exposed through the mask and treated to remove the unpolymerized areas and form the relief.

U.S. Pat. No. 5,760,880 discloses an apparatus for imagewise exposing a laser radiation sensitive layer, and specifically imagewise ablating the infrared radiation sensitive layer from the photosensitive element. The photosensitive element is mounted onto a rotatable cylindrical surface, i.e., a drum, for the element to be exposed to the laser radiation. The drum rotates at speeds from 200 to 2000 rpm during exposure.

In use, considerable time and effort are involved to manually mount a photosensitive element onto the drum of the laser radiation apparatus, place the drum in the apparatus and align the element for proper exposure. For some printing jobs, such as flexible packaging, tag and label, and bag and sacks, only strip portions of a photosensitive element are needed. For other printing jobs, a flexographic printing plate is often assembled from individual pieces. Such assembly might be required, for example, by the subject being printed, for reasons of economy, or to achieve a larger plate format. In both printing jobs, the width of the strips or portions of the photosensitive element is less than the full width of the drum. So, it is desirable to maximize the productivity of the laser radiation exposure apparatus by occupying the entire drum surface with one or more photosensitive elements.

Further, as each successive photosensitive element is mounted onto the same cylindrical drum surface for use in the laser radiation exposure apparatus, the elements should be mounted with the same considerations with which printing elements are mounted onto printing cylinders, such as balance, registration, and absence of trapped air bubbles. It is desirable to eliminate manual mounting of the photosensitive elements onto the drum and take advantage of mounting technology used in apparatus for mounting flexographic printing plates onto printing cylinders. It is also desirable to avoid mistakes in registration which can occur with conventional mounting methods.

Prior to mounting the photosensitive element onto the cylindrical drum surface, the coversheet is removed from the photosensitive element. Otherwise, if the coversheet is kept with the photosensitive element, the coversheet will shift as the element is secured to the drum and will damage the laser radiation sensitive layer. However, after removal of the coversheet, the laser radiation sensitive layer of the photosensitive element is very susceptible to contamination by dust, and to damage, particularly if touched or handled. So it is important to maintain the integrity of the laser radiation sensitive layer for each photosensitive element as each successive photosensitive element is mounted onto the cylindrical drum.

SUMMARY OF THE INVENTION

The present invention provides a method for mounting at least one photosensitive printing element onto a cylindrical element containing a previously mounted first photosensitive printing element without contacting an outermost surface of the first photosensitive printing element. Accordingly, the invention provides a method for mounting at least two photosensitive printing elements onto an outer surface of a cylindrical element, wherein the photosensitive printing element comprises in order a support, a photopolymerizable layer, a layer of a laser radiation-sensitive material, and a coversheet. The method comprises:

positioning a leading edge of a first photosensitive printing element in a nip formed between the cylindrical element and a roller;

capturing the leading edge of the first photosensitive printing element in the nip by contacting the coversheet to the roller;

removing the coversheet from the first photosensitive printing element while rotating the cylindrical element to mount the first element to the outer surface;

positioning a leading edge of a second photosensitive printing element in the nip adjacent to the first photosensitive printing element;

capturing the leading edge of the second photosensitive printing element in the nip by contacting the coversheet to the roller, thereby forming a gap between an outermost surface of the first element and the roller; and removing the coversheet from the second photosensitive printing element while rotating the cylindrical element to mount the second element to the outer surface.

DETAILED DESCRIPTION OF THE PREFERRED EMBODIMENT(S)

Figure 1:
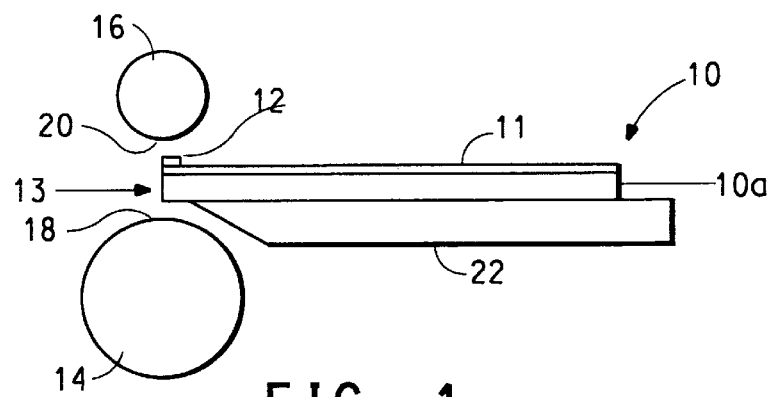
FIG. 1 is a schematic side view of a step in the method of the present invention showing capturing a leading edge of a first photosensitive printing element in a nip between a cylindrical element and a roller.

Throughout the following detailed description, similar reference characters refer to similar elements in all figures of the drawings.

The present invention provides a method for mounting photosensitive printing elements onto a cylindrical element. The photosensitive printing element, after imagewise exposure and treatment to form a relief surface, is suitable for use as a flexographic printing plate. The photosensitive printing element includes in order, a support, at least one photopolymerizable layer, a laser radiation sensitive layer and a coversheet. One or more optional layers may be between the support and the at least one photopolymerizable layer or between the photopolymerizable layer and the laser radiation sensitive layer.

Apparatus for mounting flexographic printing plates onto a printing cylinder have been disclosed, for example, in EP 0 329 228 A1 and U.S. Pat. Nos. 5,488,781, 4,872,407, and 4,520,389. Further, a commercial apparatus for mounting flexographic printing plates onto printing cylinders is available as CYREL® Microflex mounting and proofing system by DuPont (Wilmington, Del). The flexographic printing plate which is mounted onto a print cylinder by a conventional mounting apparatus has already undergone the steps of imagewise exposure and treatment to form the relief printing surface on the plate, and therefore does not have some of the concerns associated with mounting of photosensitive printing elements, such as removal of the coversheet or potential damage to the laser radiation layer. It is within the skill of one in the art to modify mounting apparatuses which are used to mount printing plates onto printing cylinders to accommodate mounting of raw, i.e., unexposed, photosensitive printing elements, onto a drum or cylindrical element. A table, movable in two directions relative to an axis of the cylindrical element or drum, may be included in the apparatus for easy positioning of the printing element onto the cylindrical element or drum.

The present method for mounting of unexposed photosensitive printing elements onto a cylindrical element is carried out in a mounting device that accommodates the cylindrical element. The device includes a roller adjacent the cylindrical element that forms a nip with the cylindrical element. The position of the cylindrical element and/or the roller can be adjusted relative to each other, thereby changing the distance between an outer surface of the cylindrical element and an outer surface of the roller at the nip.

FIG. 1 shows photosensitive printing elements 10 suitable for use in the present method comprising, in order, a support, at least one photopolymerizable layer, a laser radiation-sensitive layer, and a coversheet 11. One or more auxiliary layers, such as a second photopolymerizable layer, or a barrier layer, may be between the photopolymerizable layer and/or the laser radiation-sensitive layer. Typically, each of the photosensitive elements which are to be mounted on the same cylindrical element, will include on the side of the support opposite the photopolymerizable layer, a double-sided adhesive tape (not shown) for securing the photosensitive element 10 to the cylindrical element. Further, each of the photosensitive printing elements 10 has a leading edge. An additional double-sided adhesive tape 12 is placed at the leading edge of each of the elements 10 on the side of the coversheet 11 opposite the laser radiation-sensitive layer and the photopolymerizable layer.

FIG. 1 further shows the first step of the method of the present invention comprising positioning the leading edge of a first photosensitive printing element 10a in a nip 13 formed between a cylindrical element 14 and a roller 16. Initially, the distance from an outer surface 18 of the cylindrical element 14 to an outer surface 20 of the roller 16 at the nip 13 is greater than the total thickness including tapes of the printing element 10. The first photosensitive printing element 10a is positioned so that the leading edge of the element is first to enter the nip 13. A moveable table 22 which is adjacent the cylindrical element 14 may be used to help position the element 10. The moveable table 22 moves in a first direction parallel to an axis of the cylindrical element 14 and in a second direction perpendicular to the axis of the cylindrical element 14 to correctly locate the photosensitive printing element 10a in the nip 13. The photosensitive printing element 10a is moved into the nip 13 so that the leading edge of the element 10a is positioned between the roller 16 and cylindrical element 14.

The cylindrical element 14 and/or the roller 16 are moved vertically together at the nip 13, thereby capturing the leading edge of the first photosensitive printing element 10a in the nip. The adhesive tape 12 on the coversheet 11 at the leading edge of the photosensitive element 10a contacts the roller 16. Pressure may be exerted by the roller 16 onto the leading edge of the photosensitive printing element 10a to assure contact with the adhesive strip 12.

Figure 2:
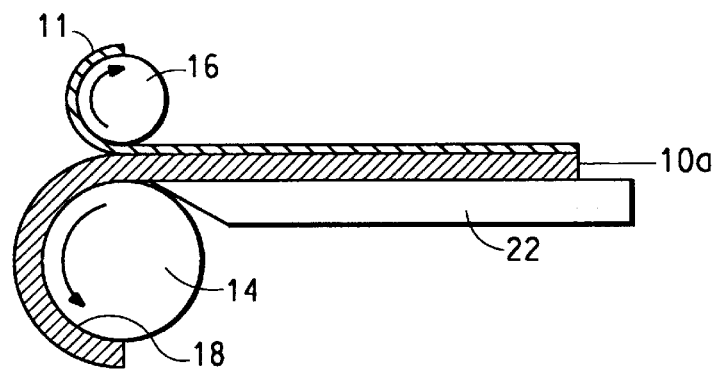
FIG. 2 is a schematic side view of a step in the present invention showing removing a coversheet from the first photosensitive element while mounting the photosensitive element to the cylindrical element.

FIG. 2 shows the cylindrical element 14 being rotated to mount the photosensitive printing element 10a to the outer surface 18 of the cylindrical element 14. The adhesive on the support of the photopolymerizable printing element 10a secures the photosensitive element to the cylindrical element 14. Since the coversheet 11 is adhered to the roller 16, the rotation of the roller 16 lifts the leading edge of the coversheet 11 and removes the coversheet 11 from the first photosensitive printing element 10a while the cylindrical element 16 is rotating. The coversheet 11 as it is being removed from the photosensitive printing element 10a travels around the roller 16. As the roller 16 completes its first rotation, the leading edge of the coversheet 11 is manually removed from the roller 16 and the coversheet 11 is held as the rest of the photosensitive printing element 10a is being mounted. Upon removal of the coversheet 11 from the first photosensitive printing element 10a, the laser radiation-sensitive layer is no longer protected and is susceptible to damage. The roller 16 and/or the cylindrical element 14 vertically separate before the roller 16 could contact the laser radiation-sensitive layer of the first photosensitive element 10a.

Next, a second photosensitive printing element 10b is mounted onto the outer surface 18 of the cylindrical element 14, adjacent or near the mounted first photosensitive printing element 10a. Similar to the positioning step for the first photosensitive element 10a, a leading edge of the second photosensitive printing element 10b is positioned in the nip 13 between the cylindrical element 14 and the roller 16. The second photosensitive printing element 10b is positioned so that the leading edge of the element 10b is the first to enter the nip 13. The distance d between the outer surface 18 of the cylindrical element 14 and the outer surface 20 of the roller 16 is greater than the total thickness of the second printing element 10b.

Figure 3:
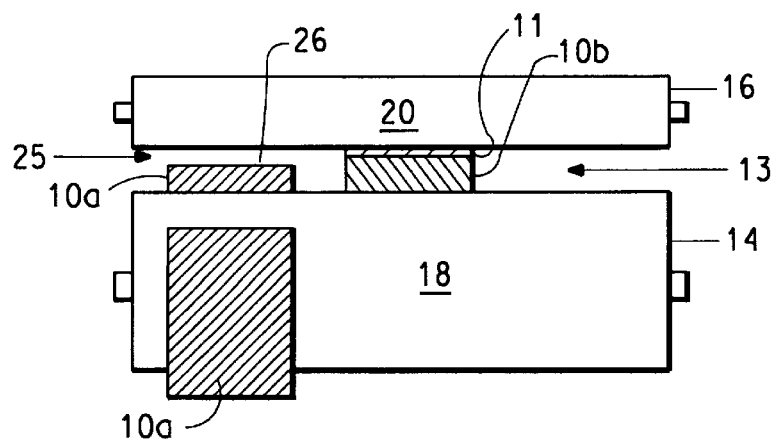
FIG. 3 is a schematic front view of a step in the present invention showing the roller capturing a leading edge of a second photosensitive printing element in the nip and offset from an outermost surface of the first photosensitive printing element.

FIG. 3 shows the cylindrical element 14 and/or the roller 16 being moved vertically together at the nip 13, thereby capturing the leading edge of the second photosensitive printing element 10b in the nip 13 and forming a gap 25 at the nip 13 between an outermost surface 26 of the first photosensitive printing element 10a and the roller 16. The roller 16 may be in pressure contact with the tape 12 on the coversheet 11 of the second photosensitive printing element 10b. The gap 25 formed at the nip 13 between the outermost surface 26, i.e., laser radiation-sensitive layer, and the roller 16 is substantially the same as the thickness of the coversheet 11 which was removed from the first mounted photosensitive printing element 10a. The gap 25 between the outermost surface 26 of the first photosensitive printing element 10a and the roller 16 avoids contact of the roller 16 to the first printing element 10a and thereby prevents damage to the laser radiation-sensitive layer.

Removing the coversheet 11 from the second photosensitive printing element 10b, while rotating the cylindrical element 14 to mount the second element 10b to the outer surface 18 of the cylindrical element 14, occurs substantially the same as the removing step conducted for the first photosensitive printing element 10a. The adhesive on the support of the second photosensitive printing element 10b secures the element 10b to the cylindrical element 14. Since the leading edge of the coversheet 11 is adhered to the roller 16, the rotation of the roller 16 lifts the leading edge of the coversheet 11 from the photosensitive printing element 10b and removes the coversheet 11 from the second printing element 10b while the cylindrical element 14 is rotating. The coversheet 11 travels around the roller 16 and as it completes its first rotation, the leading edge of the coversheet 11 is manually removed from the roller 16. The coversheet 11 is held as the rest of the second photosensitive printing element 10b is mounting. The roller 16 and/or cylindrical element 14 vertically separate before the roller 16 contacts the laser radiation-sensitive layer of the first and second mounted printing elements 10a, 10b, but after the coversheet 11 has been removed.

The steps of positioning, capturing and removing can be repeated as often as necessary to mount each additional photosensitive printing element on the cylindrical element without concern for damaging the uncovered delicate laser radiation-sensitive layer of the prior mounted elements. The gap 25 between the outermost surface 26 of the first or prior mounted photosensitive printing element 10 and the roller 16 avoids contact of the roller 16 to the prior mounted printing element and thereby prevents damage to the laser radiation-sensitive layer. And since the method of the present invention mounts a printing element while removing the coversheet, the laser radiation-sensitive layer will not be damaged by shifting of the coversheet as the printing element is mounted.

Further, according to the method of the present invention, two or more photosensitive printing elements can be mounted so that the leading edge of each element is staggered or offset from another printing element on the outer circumferential surface of the cylindrical element. Staggaring of the leading edge of each of the multiple photosensitive printing elements on the cylindrical element is accomplished by rotating the cylindrical element after mounting of a first printing element 10a and before mounting of a second (or subsequent) printing element 10b so that the leading edge of the second printing element 10b will be circumferentially offset from the leading edge of the first printing element 10a. Staggered positioning of the leading edges of multiple printing elements will provide for balanced spin of the cylindrical element when rotated, during imaging in a laser exposure apparatus and during press run.

A particular advantage of the present invention is that each of the multiple photosensitive printing elements are mounted with increased precision in registration onto the cylindrical element over conventional or manual mounting methods. The method of the present invention also reduces the entrapment of air bubbles between the printing element and the cylindrical element which can deter printing performance.

It is preferred that all the photosensitive printing elements which are to be mounted on the same cylindrical element have the same total thickness, i.e., sum of the thickness of the support, photopolymerizable layer/s, optional auxiliary layer/s and coversheet. This is desirable since the laser beam in a laser exposure apparatus is focused at the same surface on each element for optimum performance. It is within the skill in the art to accommodate the present method for mounting of multiple printing elements with different total thicknesses. For example, printing elements having the least thickness can be mounted first with the printing elements of increasing thickness mounted subsequently in order.

Following mounting of the unexposed photosensitive elements onto the cylindrical element or drum, the drum can be placed in a laser radiation exposure apparatus, such as disclosed in U.S. Pat. No. 5,760,880, for imagewise exposure with laser radiation to form an in-situ mask. The exposed photosensitive elements are then exposed to actinic radiation and treated to form a relief. It is contemplated that these subsequent steps of exposure and developing would be carried out on the cylindrical element as well so that the images can remain in perfect register.

What is claimed is:

1. A method for mounting at least two photosensitive printing elements onto an outer surface of a cylindrical element, wherein the photosensitive printing element comprises in order a support, a photopolymerizable layer, a layer of a laser radiation-sensitive material, and a coversheet, the method comprising:

positioning a leading edge of a first photosensitive printing element in a nip formed between the cylindrical element and a roller;

capturing the leading edge of the first photosensitive printing element in the nip by contacting the coversheet to the roller;

removing the coversheet from the first photosensitive printing element while rotating the cylindrical element to mount the first element to the outer surface;

positioning a leading edge of a second photosensitive printing element in the nip adjacent to the first photosensitive printing element;

capturing the leading edge of the second photosensitive printing element in the nip by contacting the coversheet to the roller, thereby forming a gap between an outermost surface of the first element and the roller; and removing the coversheet from the second photosensitive printing element while rotating the cylindrical element to mount the second element to the outer surface.

2. The method of claim 1 wherein the step of positioning the second photosensitive printing element further comprises staggering the leading edge of the second photosensitive printing element from the leading edge of the first photosensitive printing element on the outer surface of the cylindrical element.

3. The method of claim 1 further comprising applying pressure with the roller to the leading edge of the photosensitive printing element during the step of removing the coversheet.

4. The method of claim 1 further comprising the step of imagewise ablating the laser radiation-sensitive layer from the photosensitive layer for each photosensitive printing element.

5. The method of claim 1 wherein the steps of positioning the photosensitive printing elements further comprise placing each photosensitive printing element onto a planar surface of a moveable table and locating the leading edge of the photosensitive element in the nip between the cylindrical element and the roller.

6. The method of claim 5 wherein the step of locating the leading edge of the photosensitive element in the nip comprises moving the moveable table in a first direction parallel to an axis of the cylindrical element and in a second direction perpendicular to the axis of the cylindrical element.

7. The method of claim 1 further comprising repeating the steps of positioning, capturing and removing for each of a plurality of photosensitive elements mounted onto the cylindrical element.

* * * * *